(12) United States Patent
Hopkins et al.

(10) Patent No.: US 7,979,819 B2
(45) Date of Patent: Jul. 12, 2011

(54) MINTERM TRACING AND REPORTING

(75) Inventors: Jeremy T. Hopkins, Round Rock, TX (US); Thomas E. Rosser, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 12/358,793

(22) Filed: Jan. 23, 2009

(65) Prior Publication Data

US 2010/0192116 A1   Jul. 29, 2010

(51) Int. Cl.
  *G06F 17/50* (2006.01)
(52) U.S. Cl. ........ 716/104; 716/106; 716/103; 716/136; 703/16
(58) Field of Classification Search .................... 703/16; 716/4, 7, 104, 106, 103, 136
  See application file for complete search history.

(56) References Cited

U.S. PATENT DOCUMENTS

| 6,453,454 | B1 | 9/2002 | Lee et al. |
| 2004/0230933 | A1 | 11/2004 | Weaver, Jr. et al. |
| 2006/0114135 | A1 | 6/2006 | Whitaker et al. |
| 2007/0079274 | A1 | 4/2007 | Tetelbaum |
| 2007/0094629 | A1 | 4/2007 | Alter et al. |
| 2007/0106970 | A1 | 5/2007 | Fukuda |
| 2008/0077900 | A1 | 3/2008 | Oh et al. |

FOREIGN PATENT DOCUMENTS

| JP | 2002259477 A | 9/2002 |
| JP | 2003007828 A | 1/2003 |

*Primary Examiner* — Phallaka Kik
(74) *Attorney, Agent, or Firm* — Dillon & Yudell LLP (57) ABSTRACT

Disclosed are a method, a system and a computer program product for determining and reporting minterms to aid in implementing an engineering change order (ECO). A Minterm Tracing and Reporting (MTR) utility, which executes on a computer system, receives two or more timing points of an optimized netlist, where one or more of the two or more timing points are received from one or more of a user, a memory medium, and/or a network. For example, a timing point is a primary input, a primary output, or a latch point. After receiving the two or more timing points of the optimized netlist, the MTR utility determines two or more minterms of the optimized netlist. In determining the minterms, from one timing point to a next timing point: a polarity at the timing point may be determined, and a forward trace from the timing point to the next timing point is performed to determine the two or more minterms of the optimized netlist. In the forward trace from the timing point to the next timing point, the MTR utility determines two or more logical cones and one or more intersections of the logical cones. The MTR utility reports (e.g., communicates) each of the determined minterms, the determined polarities, and the one or more intersections of logical cones to one or more of a computer-executable application, a network, a memory medium, and/or a display.

15 Claims, 5 Drawing Sheets

MINTERM TRACING AND REPORTING

BACKGROUND

1. Technical Field

The present invention generally relates to changing logical networks to aid in implementing change orders and in particular to changing logical networks that have been optimized from a hardware description language.

2. Description of the Related Art

There are times when an existing random logic macro (RLM) netlist needs to be modified to implement an engineering change order (ECO) to fix a problem or add an enhancement without changing and/or affecting other sections of the netlist. For example, to implement an ECO in a RLM, a circuit designer must be able to identify nets in a logical cone affected by the ECO and nets with which the circuit designer can construct new logic specified by the ECO. When logical optimization happens, nets that exist in a hardware description language (e.g., VHDL (VHSIC (Very-High Speed Integrated Circuits) Hardware Description Language), Verilog, etc.) may not exist in an optimized netlist. This happens because one or more computer-implemented optimization methods have been applied such that, in creating the optimized netlist, one or more simple functions may have been combined into complex functions and/or one or more complex functions may have been expanded into simple functions.

SUMMARY OF ILLUSTRATIVE EMBODIMENTS

Disclosed are a method, a system and a computer program product for determining and reporting minterms to aid in implementing an engineering change order (ECO). A minterm is a "logical minterm" or a "logical maxterm". A logical minterm is a Boolean function of N variables x1, x2, . . . , xN of a product term (a logical operator "AND") where each of the N variables appear once (complimented or uncomplemented), and a logical maxterm is a Boolean function of M variables y1, y2, . . . , yM of a disjunction operator (a logical operator "OR") and a complement operator. A Minterm Tracing and Reporting (MTR) utility, which executes on a computer system, receives two or more timing points of an optimized netlist, where one or more of the two or more timing points are received from one or more of a user, a memory medium (e.g., random access memory, non-volatile memory, network accessible memory, etc.), and/or a network (e.g., a local area network, a wide area network, a public network such as an Internet, etc.). For example, a timing point is a primary input, a primary output, or a latch point. After receiving the two or more timing points of the optimized netlist, the MTR utility determines two or more minterms of the optimized netlist. In determining the minterms, from one timing point to a next timing point: a polarity at the timing point may be determined, and a forward trace from the timing point to the next timing point is performed to determine the two or more minterms of the optimized netlist. In the forward trace from the timing point to the next timing point, the MTR utility determines two or more logical cones and one or more intersections of the logical cones. The MTR utility reports (e.g., communicates) each of the determined minterms, the determined polarities, and the one or more intersections of logical cones to one or more of a computer-executable application, a network, a memory medium, and/or a display.

The above as well as additional objectives, features, and advantages of the present invention will become apparent in the following detailed written description.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The illustrative embodiments provide a method, system and computer program product for determining and reporting minterms to aid in implementing an engineering change order (ECO). A Minterm Tracing and Reporting (MTR) utility (which executes on a computer system) receives two or more timing points of an optimized netlist, where one or more of the timing points may be received from one or more of a user, a memory medium, and/or a network. For example, a timing point is a primary input, a primary output, or a latch point. The MTR utility determines two or more minterms of the optimized netlist by tracing forward from timing point to timing point where: (a) a polarity at the timing point may be determined; (b) in the forward trace, two or more logical cones may be determined; and (c) one or more intersections of the logical cones may also be determined. The MTR utility reports (e.g., communicates) each of the determined minterms, the determined polarities, and the one or more intersections of logical cones to one or more of a computer-executable application, a network, a memory medium, and/or a display.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized. Specifically, as utilized herein, the following terms are defined as follows: a logical minterm is Boolean function of N variables x1, x2, . . . , xN of a product term (a logical operator "AND") where each of the N variables appear once (complimented or uncomplemented); a logical maxterm is Boolean function of M variables y1, y2, . . . , yM of a disjunction operator (a logical operator "OR") and a complement operator; a "minterm" is "logical minterm" or a "logical maxterm"; a timing point is net originating from a latch output, a net originating from a primary input, a net terminating at a latch input, or a net terminating at a primary output; a sum of products (SOP) is function expressed as a product (logical AND) of logical maxterms, and a product of sums (POS) is function expressed as a disjunction (logical OR) of logical minterms; a logic designer may be a person who controls a design in a hardware description language; and a circuit designer may be a person who implements the design, described by the hardware description language, to be fabricated.

Figure 1:
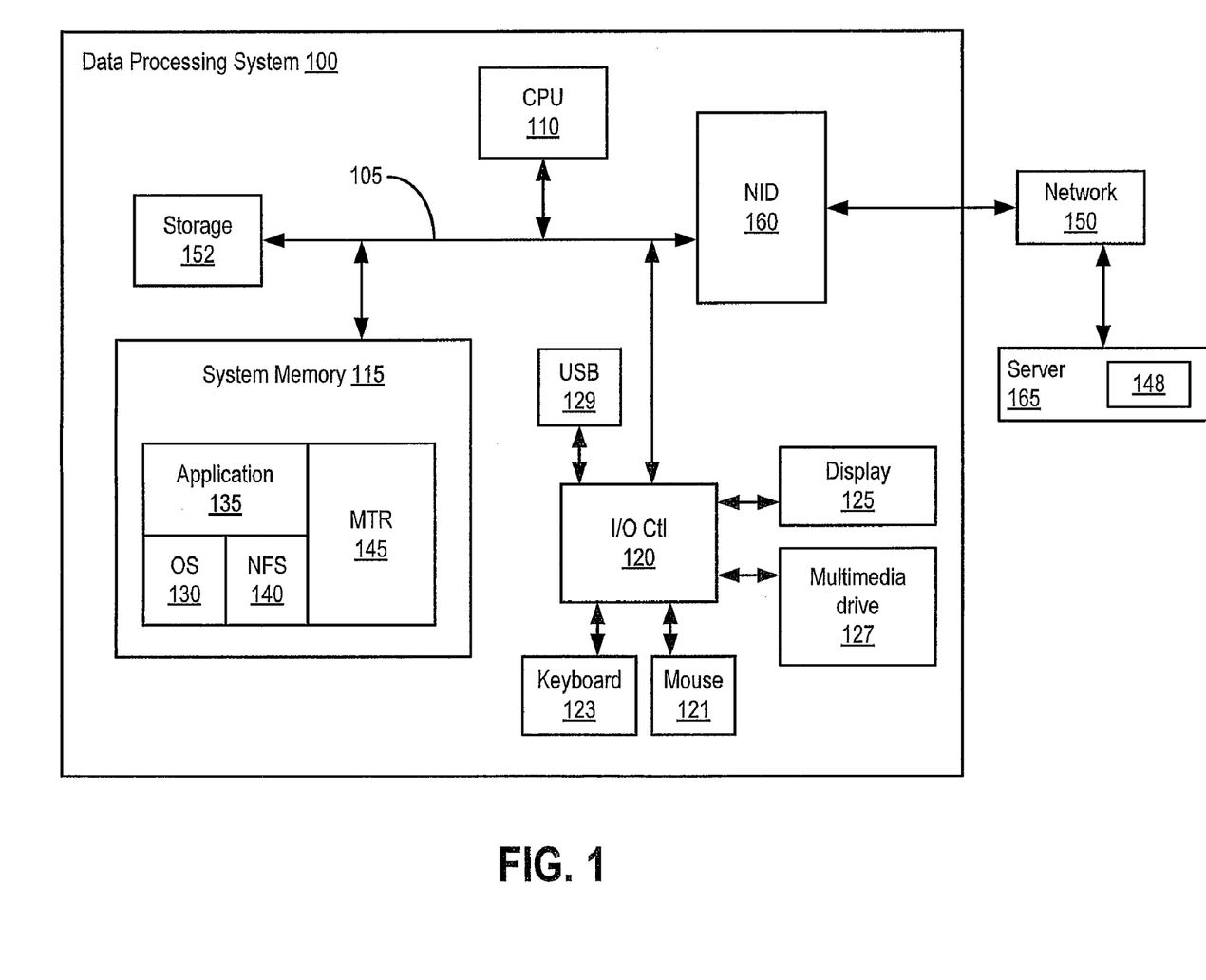
FIG. 1 provides a block diagram of a data processing system configured with hardware and software components for implementing one or more embodiments of the present invention.

With reference now to the figures, and beginning with FIG. 1, there is depicted a block diagram representation of an example data processing system (DPS) 100 as utilized within one embodiment. DPS 100 may be a computer, a portable device, such as a personal digital assistant (PDA), a smart phone, and/or other types of electronic devices that may generally be considered processing devices. As illustrated, DPS 100 includes at least one processor or central processing unit (CPU) 110 connected to system memory 115 via system interconnect/bus 105. Also connected to system bus 105 is input/output (I/O) controller 120, which provides connectivity and control for input devices, of which pointing device (or mouse) 121 and keyboard 123 are illustrated. I/O controller 120 also provides connectivity and control for output devices, of which display 125 is illustrated. Additionally, multimedia drive 127 (e.g., compact disk read/write (CDRW), digital video disk (DVD) drive, etc.) and USB (universal serial bus) port 129 are illustrated, coupled to I/O controller 120. Multimedia drive 127 and an USB port 129 enable insertion of a removable storage device (e.g., optical disk, "thumb" drive, etc.) on which data/instructions/code may be stored and/or from which data/instructions/code may be retrieved. DPS 100 also includes storage 152, within/from which data/instructions/code may also be stored/retrieved.

DPS 100 is also illustrated with network interface device (NID) 160, by which DPS 100 may connect to one or more networks, such as network 150. In one or more embodiments, network 150 may include and/or be coupled to another network, such as a wide area network (e.g., a wide area corporate network, the Internet, etc.), a local area network (LAN), a public switched telephone network (PSTN), or a virtual private network (VPN), among others). In one embodiment, the Internet represents/is a worldwide collection of networks and gateways that may utilize one or more protocols (e.g., Internet Protocol (IP), Transmission Control Protocol (TCP), User Datagram Protocol (UDP), Internet Control Message Protocol (ICMP), etc.). NID 160 may be configured to operate via wired and/or wireless connection to an access point of one or more networks. Connection to network 150 may be utilized to establish with one or more servers, such as server 165. In one embodiment, server 165 provides one or more of data, instructions, and code for execution on DPS 100.

In one embodiment, server 165 includes a software deploying server, and DPS 100 communicates with the software deploying server 165 via network 150 using network interface device 160. In one example, MTR utility 148 (which may include various functionalities associated with MTR utility 145) of server 165 may be deployed from/on network 150, via software deploying server 165. With this configuration, software-deploying server 165 performs all or almost all of the functions associated with the execution of MTR utility 148. Accordingly, DPS 100 is not required to utilize internal computing resources of DPS 100 to execute MTR utility 148. For example, MTR utility 148 is executed on server 165, while user interactions (e.g., via keyboard, mouse, display, etc.) are conducted through DPS 100 and are communicated between server 165 and DPS 100 via network 150.

In one embodiment, MTR utility 148 may be accessed through network 150 using network file system (NFS) 140, where CPU 110 executes instructions of MTR utility 148 as they are received from software deploying server 165.

In addition to the above described hardware components of DPS 100, various features of the invention are completed/supported via software, firmware, code, and/or logic stored within memory 115 and/or other storage (e.g., storage 152) and executed by CPU 110. Thus, for example, illustrated within memory 115 are a number of software/firmware/logic components, including an operating system (OS) 130 (e.g., Microsoft Windows®, a trademark of Microsoft Corp, or GNU®/Linux®, registered trademarks of the Free Software Foundation and The Linux Mark Institute), application 135, and MTR utility 145 which executes on CPU 110 to provide one or more reports of minterms of two or more timing points (positive and inverted) using logic from an existing optimized netlist by tracing the optimized netlist from timing point to timing point. In actual implementation, MTR utility 145 may be combined with or incorporated within application 135 to provide a single executable component, collectively providing the various functions of each individual software component when the corresponding combined code is executed by the CPU 110. For simplicity, MTR utility 145 is illustrated and described as a stand alone or separate software/firmware component, which provides specific functions, as described below.

CPU 110 executes MTR utility 145 as well as OS 130, which supports the user interface features of MTR utility 145. In one embodiment, MTR utility 145 genetates/provides several graphical user interfaces (GUI) to enable user interaction with, or manipulation of, the functional features of MTR utility 145. Certain functions supported and/or implemented by MTR utility 145 generate processing logic executed by processor and/or device hardware to complete the implementation of that function. For simplicity of the description, the collective body of code that enables these various features is referred to herein as MTR utility 145. The software code/instructions/logic provided by MTR utility 145 include: (a) code/logic for receiving two or more timing points; (b) code/logic for determining a two or more minterms; (c) code/logic for reporting the two or more minterms; (d) code/logic for reporting polarity at each timing point of the two or more timing points; and (e) code/logic for reporting one or more intersections of logical cones. According to one embodiment, when CPU 110 executes MTR utility 145, DPS 100 initiates a series of functional processes that enable the above functional features as well as additional features/functionality.

These features/functionality are described in greater detail below within the description of FIGS. 2A-3B.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Figure 2A:
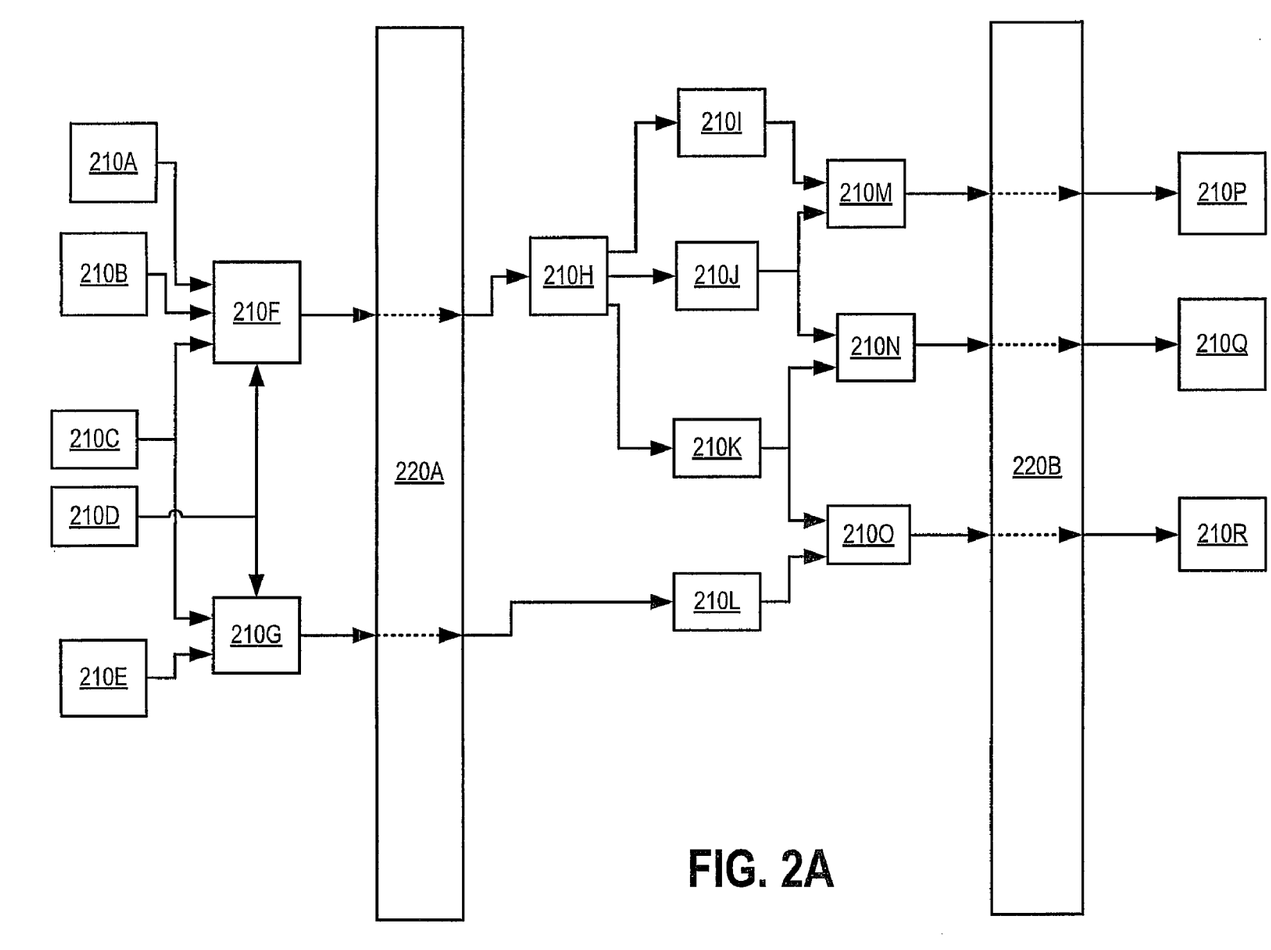
FIG. 2A illustrates a block diagram of an exemplary optimized netlist, in accordance with an embodiment of the present invention.

With reference now to FIG. 2A, a block diagram of an exemplary optimized netlist is illustrated. As shown, nets 210A-210D may be connected to net 210F, and nets 210C-210E may be connected to net 210G. Nets 210F and 210G may be connected, respectively, to nets 210H and 210L via latch 220A. Net 210H may be connected to nets 210I-210K, net 210I may be connect to net 210M, net 210J may be connected to nets 210M and 210N, net 210K may be connected to nets 210N and 210O, and net 210L may be connected to net 210O. Nets 210M-210O may be connected, respectively, to nets 210P-210R via latch 220B.

Each net of the nets 210A-210R can include one or more minterms that may be determined by MTR utility 145. One or more timing points of the netlist illustrated in FIG. 2A can be specified to MTR utility 145, where a timing point may include a net originating from a primary input (e.g., one of nets 210A-210E), a primary output (e.g., one of nets 210P-210R), a latch input (e.g., one of nets 210F, 210G, and 210M-210O), or a latch output (e.g., one of nets 210H, 210L, and 210P-210R).

MTR utility 145 determines one or more minterms included in a net by tracing forward from timing point to timing point, for one or more nets. Minterms can be structured in two forms: a SOP and a POS. By MTR utility 145 identifying one or more minterms that include one or more timing points, a logic designer can achieve greater precision when implementing an ECO in a hardware description language by using existing nets in an optimized netlist, and in reusing of one or more nets that exist in a circuit, an implementation of the ECO may be simplified.

In one example, there may not be a net or group of nets in the circuit that is logically equivalent to one or more signals used in the hardware description language. This may be, since during creation of an optimized netlist, one or more circuit logic optimization methods and/or processes have been performed to reduce circuit elements and/or signal propagation times. The logic optimization and the changes to the optimized or implemented netlist can be more difficult to carry out or accomplish using an existing semiconductor (e.g., silicon, germanium, etc.) implementation of the optimized or implemented netlist. Thus, identifying minterms allows changing of signal paths (e.g., wires, conductors, etc.) to implement the ECO, while not changing the existing semiconductor implementation. Each of the nets 210A-210R may include one or more minterms.

Figure 2B:
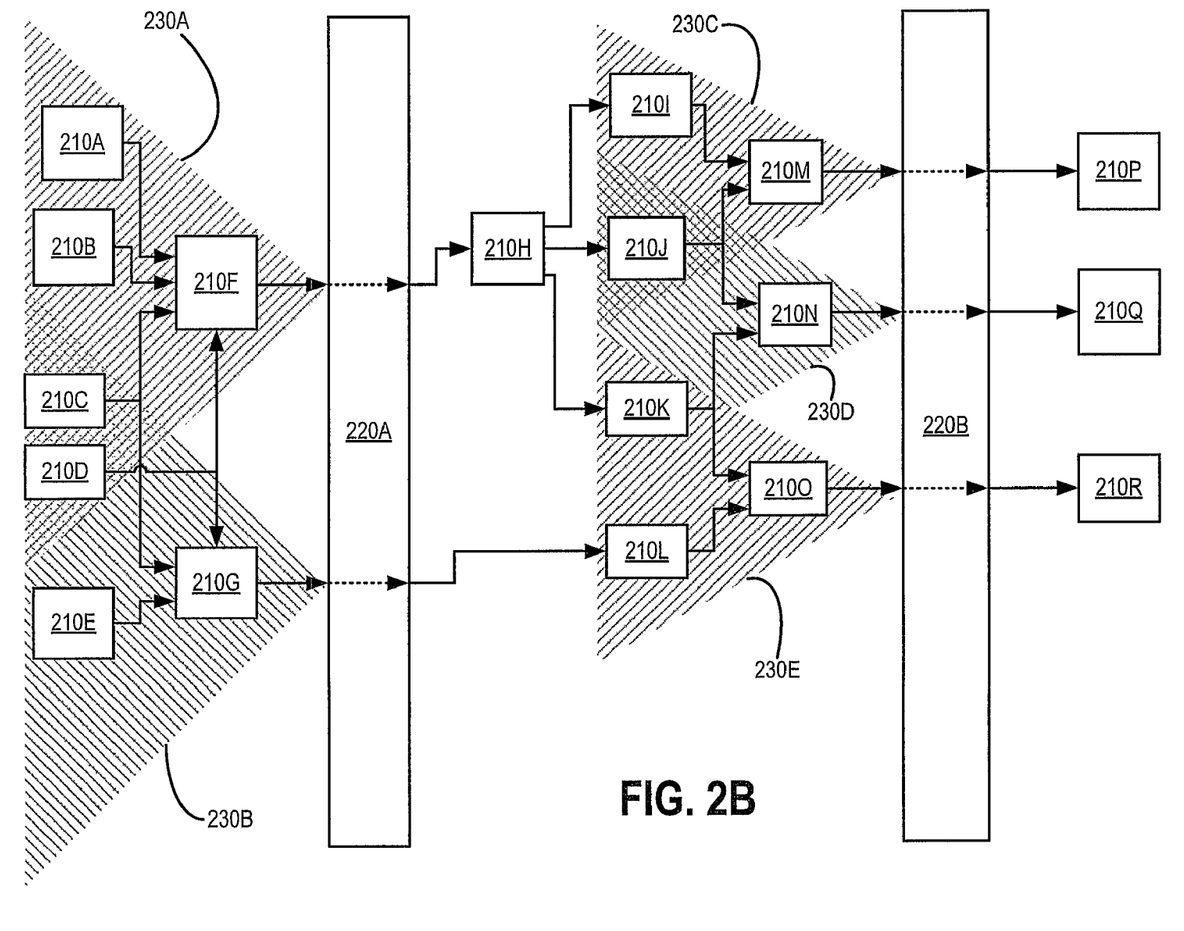
FIG. 2B illustrates a block diagram of an exemplary optimized netlist with logical cones of the optimized netlist, in accordance with an embodiment of the present invention.

As MRT utility 145 traces forward from timing point to timing point, one or more logical cones 230A-230E, as illustrated in FIG. 2B, are determined and reported by MTR utility 145. Intersections of logical cones are used to identify where an ECO may be implemented. As shown in FIG. 2B, logical cones 230A and 230B intersect at nets 210C and 210D; logical cones 230C and 230D intersect at net 210J; and logical cones 230D and 230E intersect at net 210K. Further details on MTR utility 145 determining and reporting logical cones and intersections of logical cones are described below with reference to FIGS. 3A and 3B.

Figure 3A:
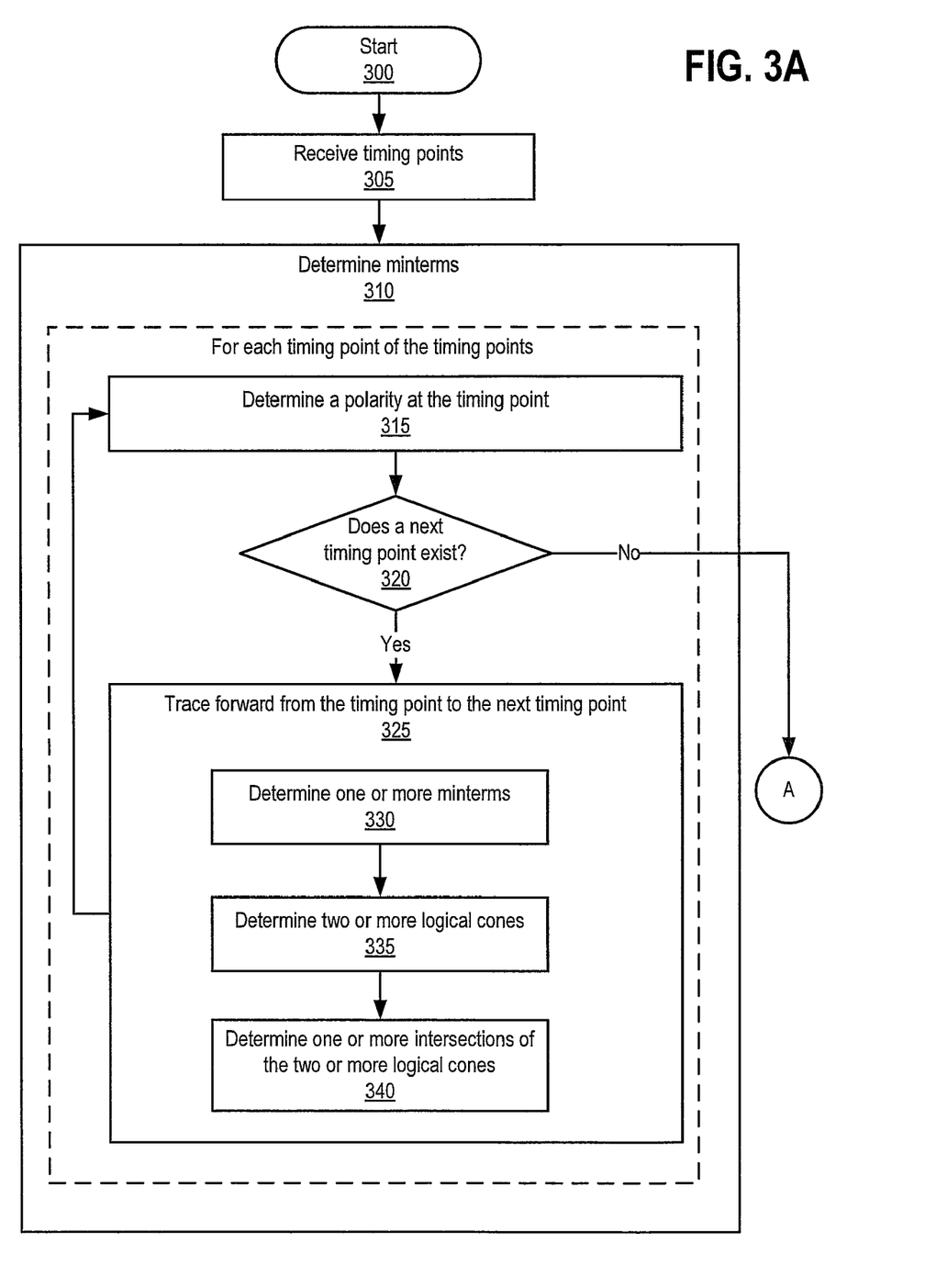
FIGS. 3A and 3B illustrate a method for minterm tracing and reporting, in accordance with an embodiment of the present invention.
Figure 3B:
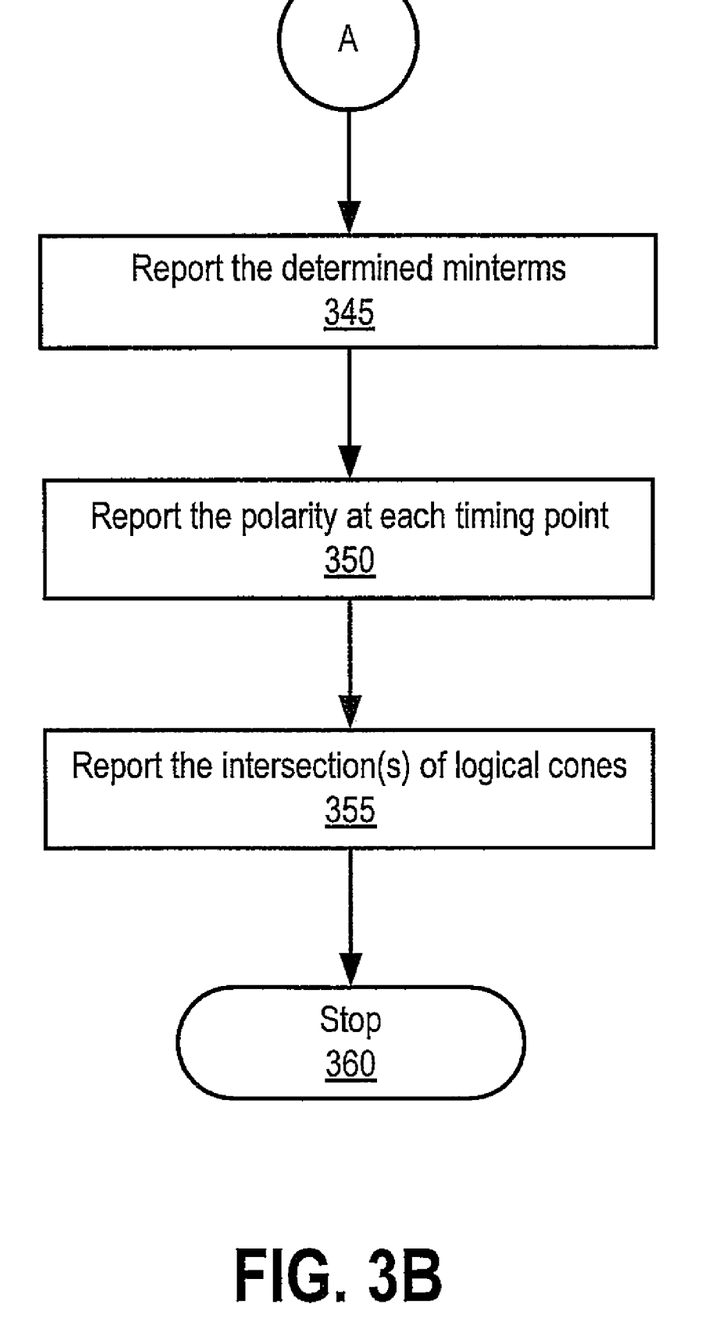

FIGS. 3A and 3B illustrate a method for minterm tracing and reporting. Although the method illustrated in FIGS. 3A and 3B may be described with reference to components shown in FIGS. 1-2B, it should be understood that this is merely for convenience and alternative components and/or configurations thereof may be employed with implementing one or more methods. Key portions of the method illustrated in FIGS. 3A and 3B may be completed by MTR utility 145 executing on CPU 110 within DPS 100 and controlling specific operations of/on DPS 100. The method is, thus, described from the perspective of either/both MTR utility and DPS 100.

The method of FIGS. 3A and 3B begins at block 300 and proceeds to block 305 where MTR utility 145 receives two or more timing points. In one or more embodiments, MTR utility 145 receives one or more of the two or more timing points from one or more of a user, a memory medium (e.g., random access memory, non-volatile memory, network accessible memory, etc.), and/or a network (e.g., network 150).

At block 310, MTR utility 145 determines two or more minterms. In determining the two or more minterms, MTR utility 145 performs blocks 315-340 for each timing point of the two or more timing points. At block 315, MTR utility 145 determines a polarity at the timing point. At block 320, MTR utility 145 determines if a next timing point exists. If a next timing point exists, the method proceeds to block 325 where MTR utility 145 traces forward through the optimized netlist from the timing point to the next timing point. In tracing forward from the timing point to the next timing point, MTR utility 145 performs blocks 330-340. At block 330, MTR utility 145 may determine one or more of the two or more minterms. At block 335, MTR utility 145 may determine two or more logical cones. For example, MTR utility 145 may determine two or more of logical cones 230A-230E.

At block 340, MTR utility 145 determines one or more intersections of the determined two or more cones. In one example, MTR utility 145 determines a first intersection of cones 230A and 230B, and the first intersection may include nets 210C and 210D. In a second example, MTR utility 145 determines a second intersection of cones 230C and 230D, and the second intersection may include net 210J. In third example, MTR utility 145 determines a third intersection, and the third intersection may include net 210K. In various instances, MTR utility 145 may determine intersections of logical cones at different iterations of tracing forward through the timing points.

If a next timing point does not exist, the method proceeds to block 345, as shown in FIG. 3B, where MTR utility 145 reports the determined minterms. In one or more embodiments, MTR utility 145 reporting the determined minterms includes communicating the determined minterms to one or more of a computer-executable application, a network, a memory medium, and/or a display, among others. At block 350, MTR utility 145 reports the determined polarities at each timing point. In one or more embodiments, MTR utility 145 reporting the determined polarities at each timing point includes communicating the determined polarities to one or more of a computer-executable application, a network, a memory medium, and/or a display, among others. At block 355, MTR utility 145 reports the determined intersection(s). In one or more embodiments, MTR utility 145 reporting the determined minterms, determined polarities, and/or determined intersection(s) includes communicating the determined minterms, determined polarities, and/or determined intersection(s) to one or more of a computer-executable application, a network, a memory medium, and/or a display, among others. At block 360, the method ends.

In one example, an equivalent of A AND B is of interest. Net 210D may equal A AND B AND C', where C' is the complement of C. MTR utility 145 performs the method illustrated in FIGS. 3A and 3B determines at block 330 and reports at block 345 that net 210D has a minterm A AND B with no inversions. A new equivalent to A AND B would be to apply a disjunction (logical OR) to net 210D with A AND B AND C. For instance, net 210D=A AND B AND C' and net 210D OR (A AND B AND C)=(A AND B AND C') OR (A AND B AND C)=(A AND B) AND (C OR C')=(A AND B). Accordingly, applying a disjunction (logical OR) of net 210D with A AND B AND C would produce the equivalent of A AND B, which is of interest.

In one embodiment, MTR utility 145 traces the number of inversions on a net (e.g., on of nets 210A-210R) and determines equivalent nets that may not include the same form. For example, A AND B is logically equivalent to (A' OR B')', even though different gates are represented in a circuit or an optimized netlist. Determining equivalent nets can be accomplished by keeping each the equation of each net in two forms: SOP and POS. For instance, (A AND B') OR (A' AND B)=(A OR B) AND (A' OR B'), where (A AND B') OR (A' AND B) is a SOP and (A OR B) AND (A' OR B') is a POS.

In the flow charts above, one or more of the methods are embodied in a computer readable medium including computer readable code such that a series of steps are performed when the computer readable code is executed (by a processing unit) on a computing device. In some implementations, certain processes of the methods are combined, performed simultaneously, concurrently (e.g., scheduled quick enough in time to appear simultaneous to a person), or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic", or "system." Furthermore, the present invention may take the form of an article of manufacture having a computer program product with a computer-usable storage medium having computer-executable program instructions/code embodied in or on the medium.

As will be further appreciated, the processes in embodiments of the present invention may be implemented using any combination of software, firmware, microcode, and/or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture including the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may include, store, communicate, propagate, or transport the program for use by or in connection with the execution system, apparatus, or device. The methods of the invention may be practiced by combining one or more machine-readable storage devices including the code according to the described embodiment(s) with appropriate processing hardware to execute the code included therein. An apparatus for practicing the invention could be one or more processing devices and storage systems including or having network access (via servers) to program(s) coded in accordance with the invention. In general, the term computer, computer system, or data processing system can be broadly defined to encompass any device having a processor (or processing unit) which executes instructions/code from a memory medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A computer-implemented method for minterm tracing and reporting, comprising:
   receiving a plurality of timing points;
   determining, by a computer, a plurality of minterms, wherein said determining the plurality of minterms includes:
   for each timing point of the plurality of timing points:
   determining a polarity at the timing point;
   determining if a next timing point exists from the plurality of timing points; and if the next timing point exists, tracing forward from the timing point to the next timing point, wherein said tracing forward includes:
    determining one or more minterms of the plurality of minterms;
    determining a plurality of logical cones; and
    determining one or more intersections of the plurality of logical cones;
reporting the plurality of minterms;
reporting the polarity at each timing point of the plurality of timing points; and
reporting the one or more intersections.

2. The method of claim 1, wherein said reporting the polarity at each timing point of the plurality of timing points includes reporting the polarity at each timing point of the plurality of timing points to one or more of a computer-executable application, a network, a memory medium, and/or a display.

3. The method of claim 1, wherein said reporting the one or more intersections includes reporting the one or more intersections to one or more of a computer-executable application, a network, a memory medium, and/or a display.

4. The method of claim 1, wherein said receiving the plurality of timing points includes receiving at least one timing point of the plurality of timing points from a user, from a memory medium, or from a network.

5. The method of claim 1, wherein said reporting the plurality of minterms includes reporting the plurality of minterms to one or more of a computer-executable application, a network, a memory medium, and/or a display.

6. A system for minterm tracing and reporting, comprising:
a processor;
a memory medium coupled to the processor; and
a utility including instructions, which when executed on the processor, provides logic for performing the function of:
    receiving a plurality of timing points;
    determining a plurality of minterms, wherein said determining the plurality of minterms includes:
        for each timing point of the plurality of timing points:
            determining a polarity at the timing point;
            determining if a next timing point exists from the plurality of timing points; and
            if the next timing point exists, tracing forward from the timing point to the next timing point, wherein said tracing forward includes:
                determining one or more minterms of the plurality of minterms;
                determining a plurality of logical cones; and
                determining one or more intersections of the plurality of logical cones;
    reporting the plurality of minterms;
    reporting the polarity at each timing point of the plurality of timing points; and
    reporting the one or more intersections.

7. The system of claim 6, wherein said reporting the polarity at each timing point of the plurality of timing points includes reporting the polarity at each timing point of the plurality of timing points to one or more of a computer-executable application, a network, a display, the memory medium, and/or a second, different, memory medium.

8. The system of claim 6, wherein said reporting the one or more intersections includes reporting the one or more intersections to one or more of a computer-executable application, a network, a display, the memory medium, and/or a second, different, memory medium.

9. The system of claim 6, wherein said receiving the plurality of timing points includes receiving at least one timing point of the plurality of timing points from a user, from a network, from the memory medium, or from a second, different, memory medium.

10. The system of claim 6, wherein said reporting the plurality of minterms includes reporting the plurality of minterms to one or more of a computer-executable application, a network, a second, different, memory medium, and/or a display.

11. A computer program product, comprising:
a non-transitory computer-readable medium; and
program instructions stored on said non-transitory computer-readable medium that when executed on a processing system, cause the processing system to perform the functions of:
    receiving a plurality of timing points;
    determining a plurality of minterms, wherein said determining the plurality of minterms includes:
        for each timing point of the plurality of timing points:
            determining a polarity at the timing point;
            determining if a next timing point exists from the plurality of timing points; and
            if the next timing point exists, tracing forward from the timing point to the next timing point, wherein said tracing forward includes:
                determining one or more minterms of the plurality of minterms;
                determining a plurality of logical cones; and
                determining one or more intersections of the plurality of logical cones;
    reporting the plurality of minterms;
    reporting the polarity at each timing point of the plurality of timing points; and
    reporting the one or more intersections.

12. The computer program product of claim 11, wherein said reporting the polarity at each timing point of the plurality of timing points includes reporting the polarity at each timing point of the plurality of timing points to one or more of a computer-executable application, a network, a display, and/or a memory medium.

13. The computer program product of claim 11, wherein said reporting the one or more intersections includes reporting the one or more intersections to one or more of a computer-executable application, a network, a display, and/or a memory medium.

14. The computer program product of claim 11, wherein said receiving the plurality of timing points includes receiving at least one timing point of the plurality of timing points from a user, from a network, or from a memory medium.

15. The computer-readable medium of claim 11, wherein said reporting the plurality of minterms includes reporting the plurality of minterms to one or more of a computer-executable application, a network, a second, different, memory medium, and/or a display.

* * * * *